United States Patent [19]

Shimada et al.

[11] Patent Number: 5,528,056
[45] Date of Patent: Jun. 18, 1996

[54] CMOS THIN-FILM TRANSISTOR HAVING SPLIT GATE STRUCTURE

[75] Inventors: Takayuki Shimada, Ikoma-gun; Toshihiro Yamashita, Yao; Yasuhiro Matsushima, Kashihara; Yoji Yoshimura; Yutaka Takafuji, both of Nara, all of Japan

[73] Assignee: Sharp Kabushiki Kaisha, Osaka, Japan

[21] Appl. No.: 392,621

[22] Filed: Feb. 22, 1995

Related U.S. Application Data

[63] Continuation of Ser. No. 798,730, Nov. 27, 1991, abandoned.

[30] Foreign Application Priority Data

Nov. 30, 1990 [JP] Japan ................................. 2-338879
Nov. 30, 1990 [JP] Japan ................................. 2-338880

[51] Int. Cl.[6] ................................................. H01L 29/76
[52] U.S. Cl. .......................... 257/72; 257/369; 257/351; 257/372; 257/66; 257/401
[58] Field of Search ................................ 257/57, 59, 72, 257/69, 369, 351, 347, 372, 365, 408, 66, 344, 444, 448, 204, 206

[56] References Cited

U.S. PATENT DOCUMENTS

| | | | |
|---|---|---|---|
| 4,698,659 | 10/1987 | Mizutani | 257/69 |
| 4,920,066 | 4/1990 | Hong et al. | 257/369 |
| 4,951,113 | 8/1990 | Huang et al. | 257/369 |
| 4,975,757 | 12/1990 | Egawa et al. | 257/369 |
| 4,980,732 | 12/1990 | Okazawa | 257/369 |
| 4,994,866 | 2/1991 | Awano | 257/190 |
| 5,012,315 | 4/1991 | Shur | 257/365 |
| 5,124,769 | 6/1992 | Tanaka et al. | 257/366 |
| 5,250,835 | 10/1993 | Izawa | 257/365 |
| 5,338,959 | 8/1994 | Kim et al. | 257/365 |

FOREIGN PATENT DOCUMENTS

| | | | |
|---|---|---|---|
| 0239958 | 10/1987 | European Pat. Off. | |
| 0164568 | 12/1981 | Japan | 257/351 |
| 63-237571 | 10/1988 | Japan | |
| 2137272 | 5/1990 | Japan | 257/351 |

OTHER PUBLICATIONS

Proceedings of the SID. vol. 30, No. 2, 1989, Los Angeles US pp. 123–130: R. E. Proano et al: "Development and electrical properties of undoped polycrystalline silicon thin-–film transistors."

IEEE Electron Device letters. vol. 10, No. 3, Mar. 1989, New York US pp. 129–131; N. J. Thomas et al: "High–performance thin–film silicon–on–insulator CMOS transistors in porous anodized silicon."

Y. Uemoto et al, "A High–Voltage Polysilicon TFT with Multigate Structures" vol. 38, No. 1, Jan. 1991, pp. 95–100.

Primary Examiner—Robert P. Limanek
Assistant Examiner—David B. Hardy
Attorney, Agent, or Firm—Nixon & Vanderhye

[57] ABSTRACT

A thin-film semiconductor device having a CMOS inverter comprising a pair of n-type and p-type thin-film transistors, wherein the gate electrode of at least one of the paired thin-film transistors comprises a plurality of gate electrode sections spaced apart along the channel length. The channel region of the n-type thin-film transistor is doped with p-type impurities. This structure serves to reduce the leakage current and maintain high OFF resistance for a high source-drain voltage. Further, since a good symmetry of characteristics is maintained between the n-type and p-type thin-film transistors that constitute the CMOS inverter, no appreciable bias is caused in the output voltage of the CMOS inverter.

17 Claims, 8 Drawing Sheets

CMOS THIN-FILM TRANSISTOR HAVING SPLIT GATE STRUCTURE

This is a continuation of application Ser. No. 07/798,730, filed Nov. 27, 1991, now abandoned.

BACKGROUND OF THE INVENTION

1. Field of the Invention

The present invention relates to a thin-film semiconductor device, and more particularly to a thin-film semiconductor device having a CMOS structure which is suitable for driving a liquid-crystal display.

2. Description of the Prior Art

Research and development are being actively made in the field of active matrix liquid-crystal displays in which thin-film transistors (TFTs) are made as switching devices for driving every liquid crystal picture element (pixel). Research is also under way on a liquid-crystal display with a built-in driver circuit for driving the above-said TFTs. The built-in driver circuit is constituted by the TFTs directly formed on the liquid-crystal display substrate.

The smallest component in the driver circuit for driving the liquid-crystal display is the inverter which has a CMOS (Complementary Metal Oxide Semiconductor) structure constructed with a pair of n-type and p-type TFTs. Usually, a TFT having a polysilicon semiconductor layer (polysilicon TFT) is used as the above TFT; because polysilicon allows a greater mobility of electrons and holes than amorphous silicon does, and the CMOS structure is easier to construct as the n-type and p-type TFTs can be formed by the same process. The CMOS inverter constructed with polysilicon TFTs having such properties, therefore, offers excellent characteristics in terms of operating frequency and power consumption.

Figure 4:
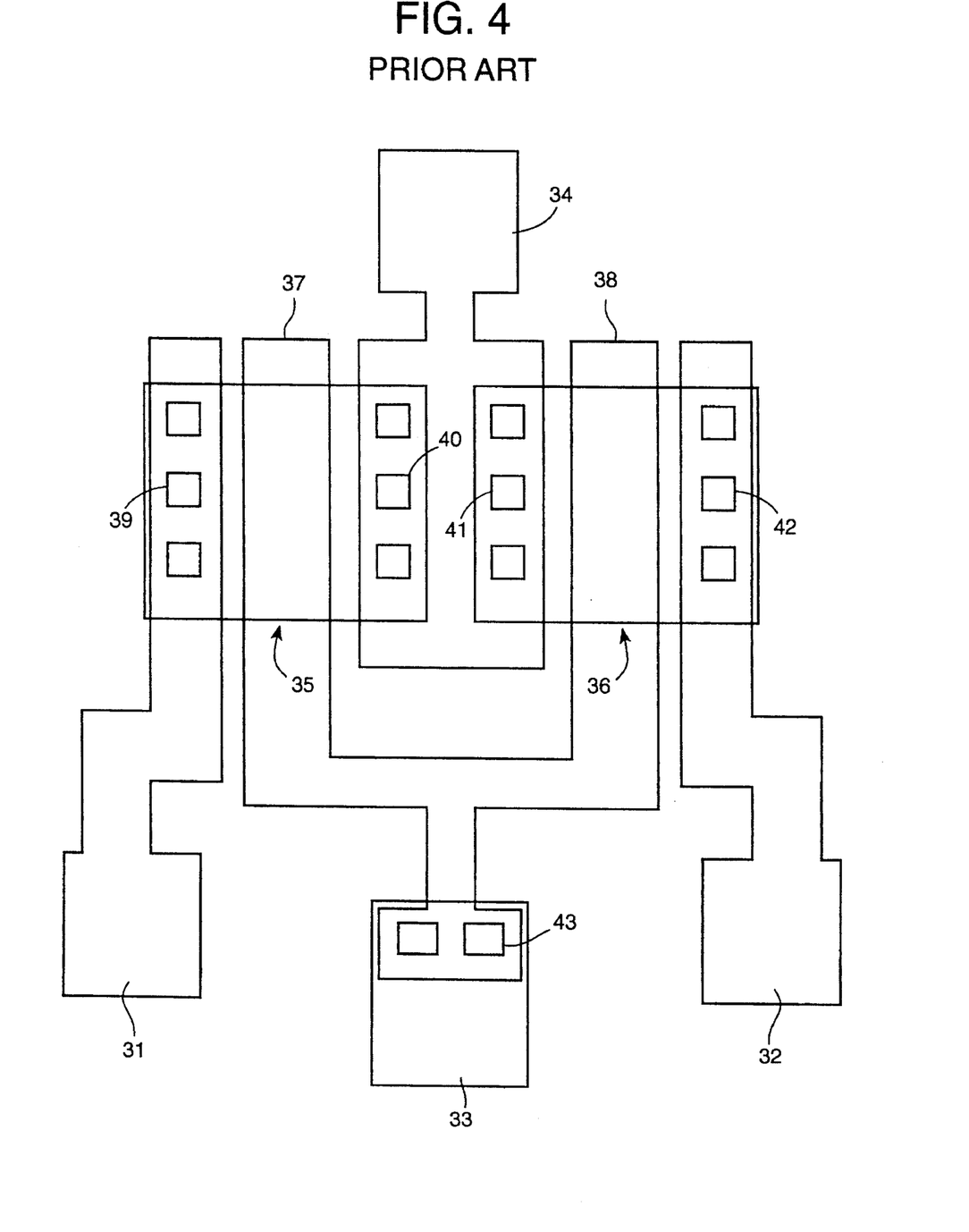
FIG. 4 is a plan view of a prior art thin-film semiconductor device.

An example of a prior art CMOS inverter is illustrated in FIG. 4. A terminal 33 is the input terminal of the inverter, and a terminal 34 is the output terminal thereof. The lower level potential (low potential) of binary logic is applied to a terminal 31, while the higher level potential (high potential) is applied to a terminal 32.

The terminal 31 to which the low potential is applied is connected to the source of an n-type TFT 35 via contact holes 39. The drain of the n-type TFT 35 is connected to the output terminal 34 of the inverter via contact holes 40. On the other hand, the terminal 32 to which the high potential is applied is connected to the source of a p-type TFT 36 via contact holes 42, and the drain of the p-type TFT 36 is connected to the output terminal 34 of the inverter via contact holes 41. The input terminal 33 of the inverter is connected to the respective gate electrodes 37 and 38 of the TFTs 35 and 36 via contact holes 43.

The potential at the output terminal 34 of the inverter is determined by the potential difference between the terminal 31 and the terminal 32, i.e., the source-drain resistance ratio between the TFTs 35 and 36. That is, when the potential of the input terminal 33 is at a low level, the n-type TFT 35 is OFF, whereas the p-type TFT 36 is ON, which means that the resistance in the p-type TFT 36 is sufficiently low compared with that in the n-type TFT 35. As a result, the high potential applied at the terminal 32 is output at the output terminal 34. Conversely, when the potential of the input terminal 33 is at the high level, the n-type TFT 35 is ON and the p-type TFT 36 is OFF, thus outputting the low potential at the output terminal 34.

Driving the driver circuit of an active matrix liquid-crystal display requires a higher voltage than the voltage (usually 5 Volts) required for driving an ordinary LSI circuit. For example, when using the normally white mode, which is said to be the best display mode currently available in terms of display characteristics, if it is desired to obtain a contrast ratio of 100:1 or higher, a voltage of about 7.5 Volts must be applied to the liquid crystals. Moreover, since the application of a DC voltage over a long period causes degradation in the liquid crystal characteristics, an AC bias must be applied to the liquid crystals.

Therefore, the gate electrode of each TFT (in the liquid crystal panel) for driving the liquid crystals in each pixel must be supplied with a voltage of the magnitude that can retain the stored picture signal for the drain potential of −7.5 Volts when the TFT is OFF; on the other hand, when the TFT is ON, the drain electrode of the TFT must be supplied with a voltage such that a picture signal of 7.5 Volts can be written. Considering the threshold voltage variation, etc. among the TFTs in the liquid crystal panel, it is required that the driver circuit of the active matrix liquid-crystal display be operated with the potential difference, $V_{hl}$, of about 20 Volts between the high and low levels.

Generally, as the source-drain voltage of a TFT is increased, a current (leakage current) will appear that flows between the source and drain of the TFT even when a potential to turn off the TFT is applied to the gate electrode thereof.

Figure 5:
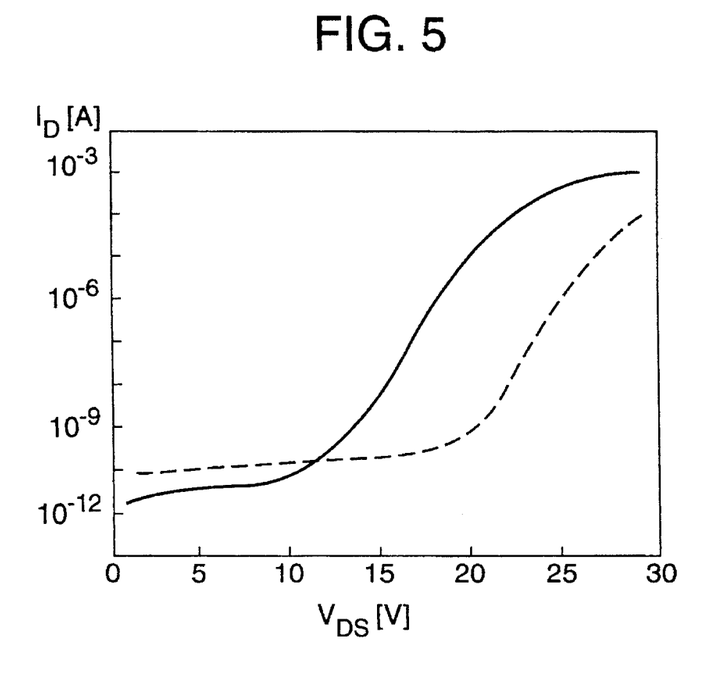
FIG. 5 is a graph showing the $I_D$-$V_{DS}$ characteristics ($V_{gs}$=0) of n-type thin-film transistors.

In FIG. 5, the solid curve shows the drain current $I_D$ as a function of the drain-source voltage $V_{DS}$ of the n-type TFT 35 when the gate-source voltage $V_{gs}$ is 0 Volts (putting the n-type TFT 35 in the OFF state).

$V_{DS}$ corresponds to the voltage that appears at the terminal 34 of the CMOS inverter of FIG. 4 when 0 Volts is applied to the terminal 31. $I_D$ corresponds to the leakage current that flows through the channel region of the n-type TFT 35 when the n-type TFT 35 is in the OFF state.

It can be seen from the characteristic curve shown by the solid curve in FIG. 5 that in the n-type TFT 35 of the prior art inverter, the leakage current ($I_D$) increases abruptly when $V_{DS}$ exceeds 15 Volts. This tendency is more apparent in n-type TFTs than in p-type TFTs.

Figure 6:
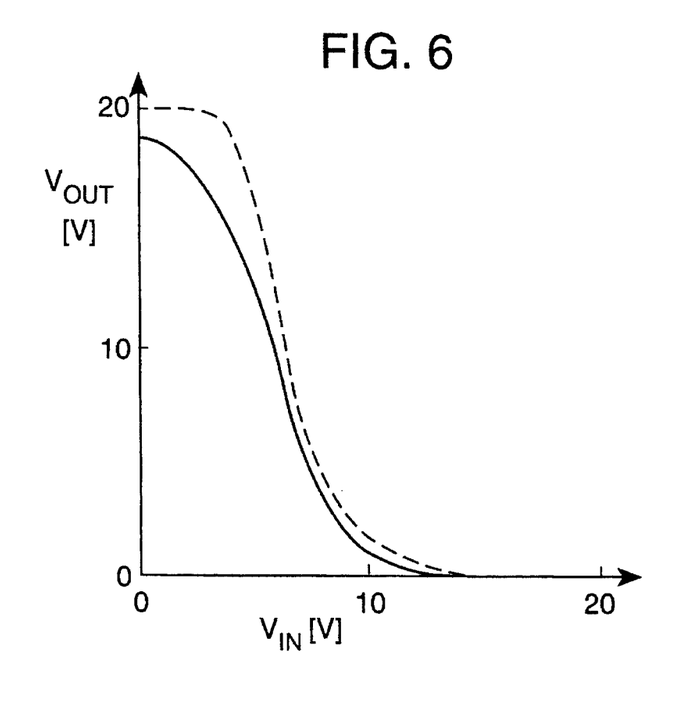
FIG. 6 is a graph showing the transfer characteristic of the CMOS inverter of the first embodiment (indicated by the dotted curve) and that of the prior art CMOS inverter (indicated by the solid curve) at $V_{HL}$=20 Volts.

Shown by the solid curve in FIG. 6 is the transfer characteristic of the CMOS inverter of FIG. 4 when $V_{HL}$=20 Volts.

When the input voltage $V_{IN}$ is 0 Volts (the n-type TFT 35 is OFF), the output voltage $V_{OUT}$ is lower than 20 Volts. This is because, even when $V_{gs}$=0 Volts (the n-type TFT 35 is OFF), the resistance in the n-type TFT 35 does not increase sufficiently due to the increased $V_{DS}$, as shown in FIG. 4, making the resistance in the p-type TFT 36 appreciable relative to the resistance in the n-type TFT 35. Thus, the effect of voltage drop by the resistance in the p-type TFT appears appreciably in the output voltage $V_{OUT}$, causing the output voltage $V_{OUT}$ to drop below 20 Volts when $V_{IN}$=0 Volts.

On the other hand, when $V_{IN}$=20 Volts, the output voltage $V_{OUT}$ is 0 Volts, which is the proper output. This is due to the difference in characteristics between the n-type and p-type TFTs.

Furthermore, the output level of the transfer characteristic is generally low. The inverter having the improper characteristic shown by the solid curve in FIG. 6 has such problems as a slower operating speed, increased susceptibility to malfunction, etc.

The prior art thin-film semiconductor device also has the following problem. Of TFTs in which the channel layer is formed from polysilicon, n-type TFTs generally have greater driving capabilities than p-type TFTs. Therefore, when a CMOS inverter as described above is constructed with polysilicon TFTS, the inverter output inverts at a lower $V_{IN}$ region since the n-type TFT has a lower resistance.

Such an unbalanced inverter characteristic is shown by the solid curve in FIG. 6. Since the characteristics are not symmetric between the n-type TFT and the p-type TFT, the curve representing the output voltage $V_{OUT}$ is biased toward the low level side with respect to $V_{IN}$. The presence of such a bias in the output voltage $V_{OUT}$ can lead to a decrease in the inverter operating speed as well as to malfunctioning of the inverter.

The output voltage $V_{OUT}$ of the inverter is determined by the potential difference $V_{HL}$ and the resistance ratio between the n-type and p-type TFTs that constitute the inverter. One approach to the correction of the bias in the output voltage $V_{OUT}$ will be by varying the channel length and width of the respective TFTs, thereby attaining an equal resistance ratio between the TFTs. For example, to attain an equal resistance ratio between the high side (p-type TFT 36) and the low side (n-type TFT 35) in the above inverter, it is required that the p-type TFT 36 has a greater channel width than that of the n-type TFT 35 or that the n-type TFT 35 has a longer channel length than that of the p-type TFT 36.

However, such an approach has the problem in that it involves a decrease in the transfer speed of the inverter and an increase of the inverter area.

SUMMARY OF THE INVENTION

The thin-film semiconductor device of this invention, which overcomes the above-discussed and numerous other disadvantages and deficiencies of the prior art, comprises a substrate; a first semiconductor layer and a second semiconductor layer formed on said substrate; an n-type thin-film transistor including a first channel region formed in said first semiconductor layer, a first gate insulating film formed on said first channel region, and a first gate electrode formed on said first gate insulating film; a p-type thin-film transistor including a second channel region formed in said second semiconductor layer, a second gate insulating film formed on said second channel region, and a second gate electrode formed on said second gate insulating film, at least one of said first and second gate electrodes comprising a plurality of gate electrode sections spaced apart along the channel length direction.

According to the invention, a thin-film semiconductor device is provided, comprising: a substrate; a first semiconductor layer and a second semiconductor layer formed on said substrate; an n-type thin-film transistor including a first channel region formed in said first semiconductor layer, a first source region formed in said first semiconductor layer, a first drain region formed in said first semiconductor layer, a first gate insulating film formed on said first channel region, and a-first gate electrode formed on said first gate insulating film; a p-type thin-film transistor including a second channel region formed in said second semiconductor layer, a second source region formed in said first semiconductor layer, a second drain region formed in said first semiconductor layer, a second gate insulating film formed on said second channel region, and a second gate electrode formed on said second gate insulating film, wherein said second drain region is connected to said first drain region, said second gate electrode is connected to said first gate electrode, and at least one of said first and second gate electrodes comprises a plurality of gate electrode sections spaced apart along the channel length direction.

In a preferred embodiment, at least one of said first and second channel regions under said at least one of said gate electrodes having said plurality of gate electrode sections, comprises a plurality of channel subregions spaced apart along the channel length direction, said channel subregions facing the respective gate electrode sections.

According to the invention, a thin-film semiconductor device is provided, comprising: a substrate; a first semiconductor layer and a second semiconductor layer formed on said substrate; an n-type thin-film transistor including a first channel region formed in said first semiconductor layer, a first source region formed in said first semiconductor layer, a first drain region formed in said first semiconductor layer, a first gate insulating film formed on said first channel region, and a first gate electrode formed on said first gate insulating film; a p-type thin-film transistor including a second channel region formed in said second semiconductor layer, a second source region formed in said first semiconductor layer, a second drain region formed in said first semiconductor layer, a second gate insulating film formed on said second channel region, and a second gate electrode formed on said second gate insulating film, wherein said second drain region is connected to said first drain region, said second gate electrode is connected to said first gate electrode, at least one of said first and second gate electrodes comprising a plurality of gate electrode sections spaced apart along the channel length direction, and said first channel region is doped with p-type impurities.

In a preferred embodiment, said second source and drain regions of said p-type thin-film transistor also are doped with p-type impurities.

In a TFT, the source-drain resistance which is created when the OFF voltage is applied to the gate electrode is provided primarily by the resistance at the p-n junction between the drain and channel regions of the TFT. However, when a voltage greater than a certain level is applied between the source and drain, a large leakage current flows across the p-n junction, thus reducing the resistance at the p-n junction.

In the thin-film transistor of the present invention, since the gate electrode and the channel region are each divided into subsections spaced apart along the channel length, the voltage applied between the source and drain is shared among a plurality of junctions formed between source and drain. For example, when the gate electrode and channel region are each divided into two subsections, the voltage applied between source and drain is shared between the two p-n junctions, each taking part of the applied voltage. In this case, since the voltage applied to each junction is reduced, the leakage current that flows across the junction decreases, thus preventing the resistance at the junction from dropping. As a result, a large OFF resistance can be maintained as a whole.

In TFTs in which the channel layer is formed from polysilicon, n-type TFTs generally have greater driving capabilities than p-type TFTs. According to the present invention, p-type impurities are implanted into the channel region of the n-type TFT in order to raise the inversion threshold voltage of the n-type TFT, thereby bringing down the driving capability of the n-type TFT close to that of the p-type TFT. Thus, the transistor characteristics are balanced between the n-type and p-type TFTs. This contributes to an improvement in the output characteristics of the CMOS inverter constructed with a pair of n-type and p-type TFTs.

Also, a plurality of p-n junctions are formed between the source and drain by dividing the gate electrode and channel region into a plurality of subsections. As a result, when a high voltage is applied between source and drain, the voltage applied to each p-n junction decreases, thereby suppressing the generation of leakage current across the p-n junction. Therefore, even when a high voltage is applied, the OFF resistance of the TFT does not decrease, thus preventing degradation in the output characteristics of the CMOS inverter.

Thus, the invention described herein makes possible the objectives of: (1) providing a thin-film semiconductor device having a CMOS inverter structure that provides a good transfer characteristic even when the potential difference $V_{HL}$ is large; and (2) providing a thin-film semiconductor device having a CMOS inverter structure in which a bias in the output voltage is eliminated without increasing the device area.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1:
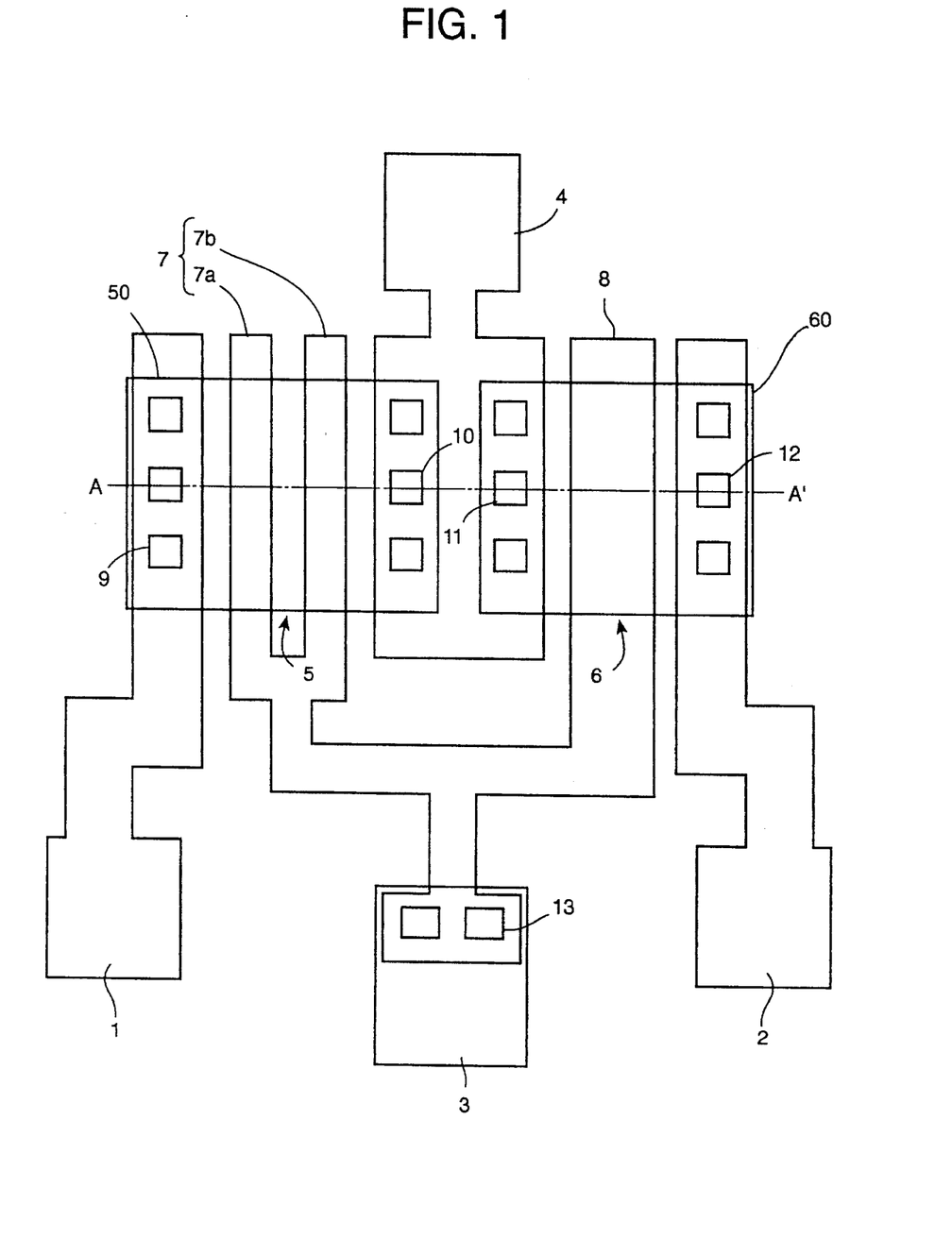
FIG. 1 is a plan view of a first embodiment of a thin-film semiconductor device according to the present invention.

FIG. 1 shows a thin-film semiconductor device (a CMOS inverter) according to the present invention. A major difference of this CMOS inverter from the prior art CMOS inverter shown in FIG. 4 is that the gate electrode 7 of an n-type TFT 5 of this embodiment is split into two sections. The branch sections of the gate electrode 7 (gate electrode sections 7a and 7b) are spaced apart along the channel length direction. In this embodiment, the channel length direction is parallel with the line A-A' in FIG. 1.

Figure 2:
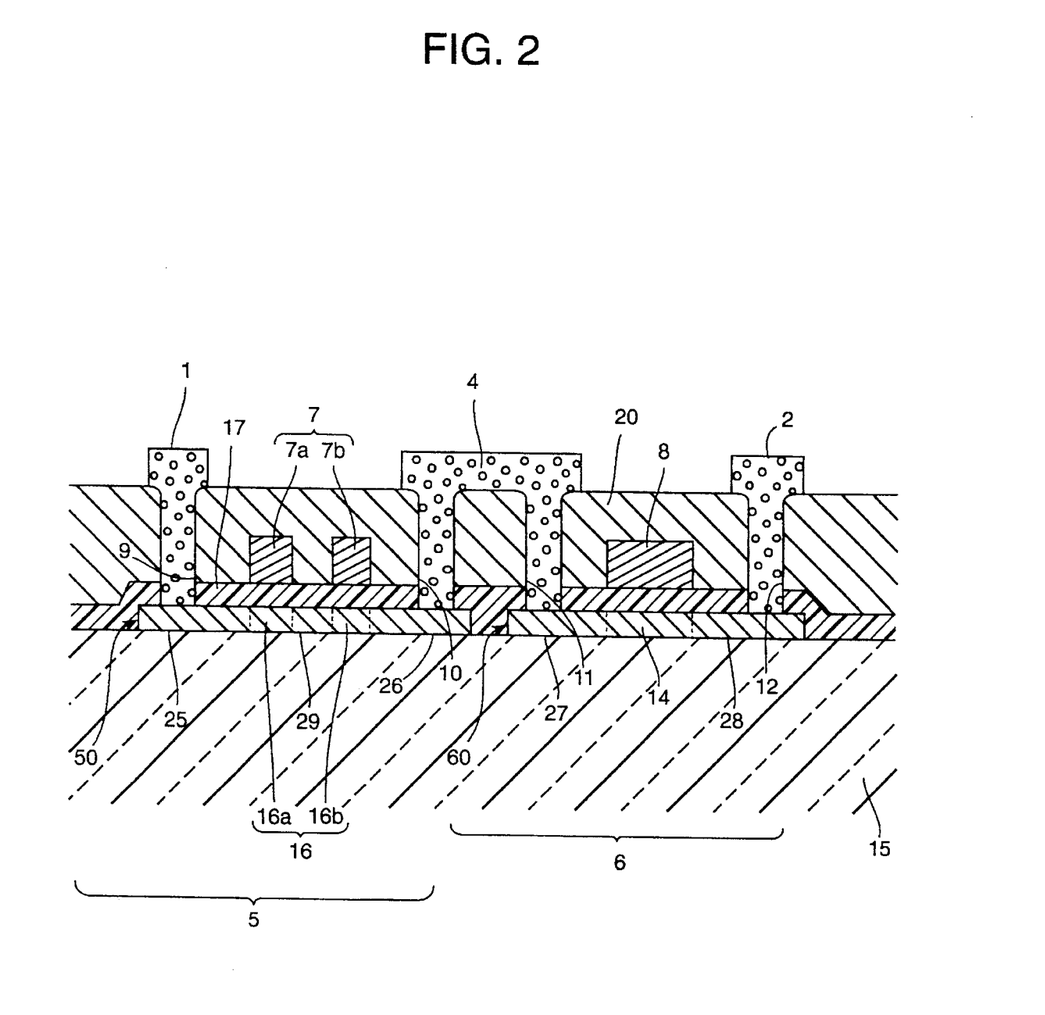
FIG. 2 is a cross sectional view taken along the line A-A' in FIG. 1.

A cross-sectional structure cut along the line A-A' in FIG. 1 is shown in FIG. 2. Referring now to FIG. 2, the structure of the CMOS inverter of this embodiment will be described below in accordance with the fabrication process sequence.

First, using a CVD method, a thin polysilicon film is formed to a thickness of 80 nm over the entire surface of a transparent insulating substrate 15. The transparent insulating substrate 15 is preferably formed from glass, quartz, or other material. The thin polysilicon film will be subsequently processed to form a channel region 16, a source region (source electrode) 25, a drain region (drain electrode) 26, and a region 29 disposed between the channel layers 16, thus forming an n-type TFT 5, a channel region 14, a source region (source electrode) 28, and a drain region (drain electrode) 27, thus forming a p-type TFT 6.

$Si^+$ ions are then implanted into this polysilicon film, which becomes amorphous as a result of the implantation. The ion implantation is followed by annealing in a nitrogen atmosphere, thus forming a thin polysilicon film having crystal grains of large diameter. As the substrate, a semiconductor substrate with an insulating film formed thereon may be used instead of the above-mentioned transparent insulating substrate.

Next, using conventional photolithography and etching techniques, the thin polysilicon film is patterned into rectangular thin polysilicon films 50 and 60 as shown in FIG. 1. The channel widths of the n-type TFT 5 and the p-type TFT 6 are determined in consideration of the driving capabilities required for the CMOS inverter. In this embodiment, the channel width is 20 μm in either TFT.

Thereafter, an oxide film 17 which serves as the gate insulating film is formed by CVD to a thickness of 100 nm. The oxide film 17 may be deposited by sputtering or may be grown by thermally oxidizing the upper surfaces of the thin polysilicon films 50 and 60.

On top of the oxide film 17, a thin polysilicon film is deposited by CVD, and this polysilicon film is then doped with impurities (dopants) by diffusion, thereby reducing the resistivity of the polysilicon film. The doping may be preformed by ion implantation instead of diffusion. In this embodiment, the thin polysilicon film is formed to a thickness of 450 nm.

By patterning this polysilicon film, the gate electrodes 7 and 8 of the respective TFTs 5 and 6 are formed. The gate electrode 7 of the n-type TFT 5 is patterned into two electrode sections 7a and 7b spaced apart along the channel length direction. The width of each gate electrode section 7a, 7b (i.e. the dimension measured along the channel length direction) is 4 μm (totaling 8 μm). The gate electrode width of the p-type TFT 6 is 8 μm.

The gate electrode 7 which extends from an input terminal 3 branches as it extends (as shown in FIG. 1) so that a voltage of the same magnitude can be applied to both the gate electrode sections 7a and 7b of the n-type TFT 5. However, the gate electrode 7 does not necessarily have to be formed in a fork-like shape with separate ends, but the ends of the gate electrode sections 7a and 7b may be connected to each other outside the channel region. Also, the gate electrode 7 may consist of two completely separate gate electrode sections 7a and 7b with an electrical interconnection provided by aluminum or other material deposited above them through an insulating film.

Next, n-type impurities are ion-implanted into the source region 25, drain region 26, and the region 29 surrounded by two gate electrode sections 7a and 7b of the n-type TFT 5. The ion implantation is performed using the gate electrode sections 7a and 7b as an implantation mask. As a result of the ion implantation, the channel region 16 of the n-type TFT 5 is divided into two channel subregions 16a and 16b spaced apart along the channel length direction. Since the region 29 has been formed in self-alignment with the gate electrode sections 7a and 7b in the same manner as the formation of the source region 25 and the drain region 26, the channel subregions 16a and 16b are placed to face the gate electrode sections 7a and 7b respectively, across the gate insulating film 17.

The thus formed region 29 is of the same conductivity type as the source region 25 and the drain region 26. On the other hand, since the channel subregions 16a and 16b are not doped with the n-type impurities, p-n junctions are formed between the region 29 and the channel subregions 16a, 16b in the off state of the transistor.

Next, in the thin polysilicon film 60, the source region 28 and the drain region 27 of the p-type TFT 6 are doped with p-type impurities by ion implantation with the gate electrode 8 as an implantation mask.

A resist that covers the area where the p-type TFT 6 is formed is used as an implantation mask when performing ion implantation to form the source and drain of the n-type TFT 5, and a resist that covers the area where the n-type TFT 5 is formed is used as an ion implantation mask when performing ion implantation to form the source and drain of the p-type TFT 6. A silicon oxide film or a silicon nitride film is deposited by CVD to a thickness of 700 nm over the entire surface of the substrate, thus forming an insulating layer 20.

Next, contact holes 9, 10, 11, 12 and 13 are opened at the positions shown in FIG. 1. As shown in FIG. 2, the contact holes 9, 10, 11, and 12 are formed penetrating both the insulating layer 20 and the gate insulating film 17 and reaching the respective gate electrodes 7 and 8. On the other hand, the contact holes 13 for the input terminal are formed penetrating the insulating layer After that, a low potential supply terminal 1, a high potential supply terminal 2, the input terminal 3, and an output terminal 4 are formed using a low-resistivity metal film formed from aluminum or other material. The terminal 1 is connected to the source region 25 of the n-type TFT 5 via the contact holes 9. The terminal 2 is connected to the source region 28 of the p-type TFT 6 via the contact holes 12, while the terminal 3 is connected to the respective gate electrodes 7 and 8 of the n-type and p-type TFTs 5 and 6 via the contact holes 13. The terminal 4 is connected to the respective drain regions 26 and 27 of the n-type and p-type TFTs via the contact holes 10 and 11, respectively.

The OFF leakage current measured on the n-type TFT 5 of the CMOS inverter is shown by the dotted curve in FIG. 5.

With the prior art n-type TFT 35 (indicated by the solid curve), the leakage current abruptly increases when $V_{DS}$ exceeds 15 Volts, the current increasing up to about 10 μA ($10^{-6}$ ampere) at $V_{DS}$=20 Volts. By contrast, with the n-type TFT 5 of the inverter of the present embodiment, the leakage current is kept at a sufficiently low level, even at $V_{DS}$=20 Volts. This is because, in the present embodiment, $V_{DS}$ is shared between the two p-n junctions and therefore the junction leakage current is reduced, thus preventing the OFF resistance of the TFT as a whole from dropping.

The dotted curve in FIG. 6 shows the transfer characteristic when $V_{HL}$=20 Volts. With the prior art inverter shown in FIG. 4, the output voltage Vout for $V_{IN}$=0 Volts is lower than 20 Volts (as indicated by the solid curve). By contrast, with the inverter of the present embodiment, the output voltage shows the correct value of 20 Volts, exhibiting the proper inverter characteristic. This is because, in this embodiment, the leakage current that flows in the n-type TFT 5 at $V_{DS}$=20 Volts is low and the OFF resistance is sufficiently high.

Figure 3:
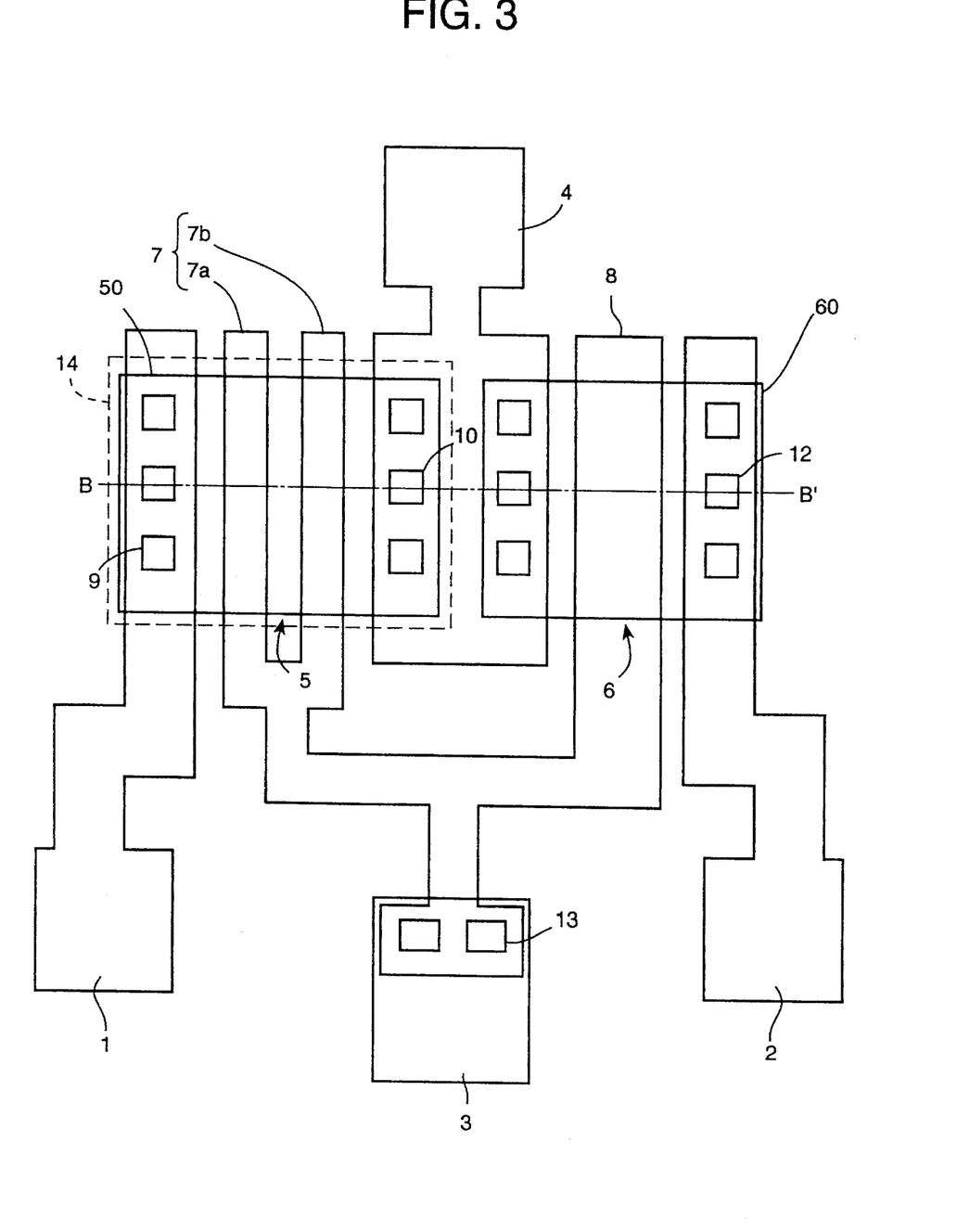
FIG. 3 is a plan view of a second embodiment of a thin-film semiconductor device according to the present invention.

FIG. 3 shows another thin-film semiconductor device of the present invention. A major difference of this embodiment from the CMOS inverter shown in FIG. 1 is that, in this embodiment, p-type impurities are implanted into the channel region of the n-type TFT 5. The cross-sectional structure cut along the line B-B' in FIG. 3 is identical to that of the first embodiment shown in FIG. 2.

The fabrication process for this embodiment will now be described. The CMOS inverter of this embodiment is fabricated by using the same processing steps as employed for the first embodiment up to the step in which the rectangular thin polysilicon films 50 and 60 shown in FIG. 3 are formed by patterning.

After the thin polysilicon film is patterned into the thin polysilicon films 50 and 60, a photoresist is applied and %he photoresist is exposed and developed into a pattern having an opening only exposing a region 14 encircled by the dotted line in FIG. 3.

Thereafter, p-type impurities such as boron ions are ion-implanted only into the region 14 of the thin polysilicon film. The dose is .Controlled to within $5\times10^{12}$ cm$^{-2}$. By varying the dose, the threshold voltage of the n-type TFT 5 can be adjusted to the desired value. A minimum dose of $1\times10^{11}$ cm$^{-2}$ will be required if it is desired to control the threshold voltage.

After removing the photoresist, an oxide film 17 which serves as the gate insulating film is formed by CVD to a thickness of 100 nm. The subsequent processing steps are the same as those for the first embodiment.

Figure 8:
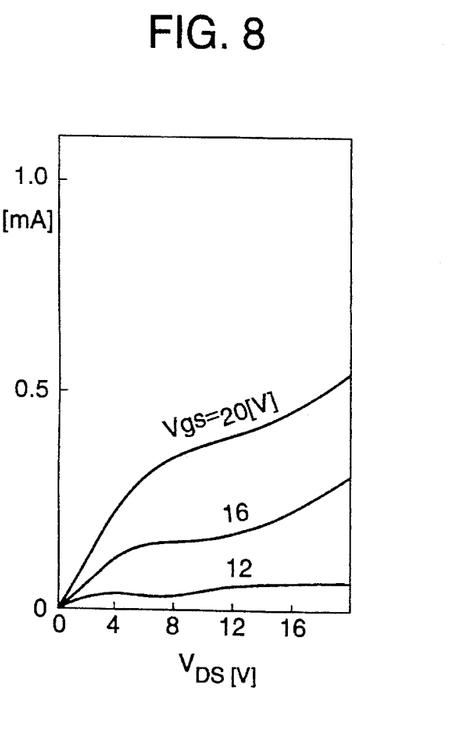
FIG. 8 is a graph showing the characteristic curves of an n-type TFT that forms part of the CMOS inverter of the second embodiment.
Figure 9:
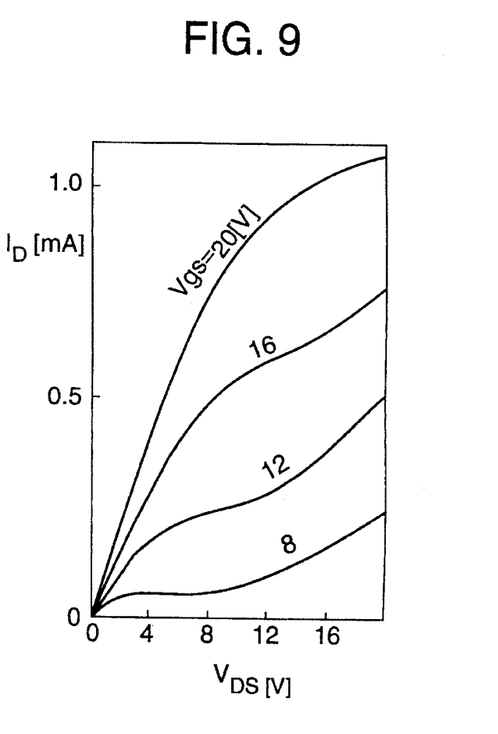
FIG. 9 is a graph showing the characteristic curves of an n-type TFT that forms part of the first embodiment.
Figure 10:
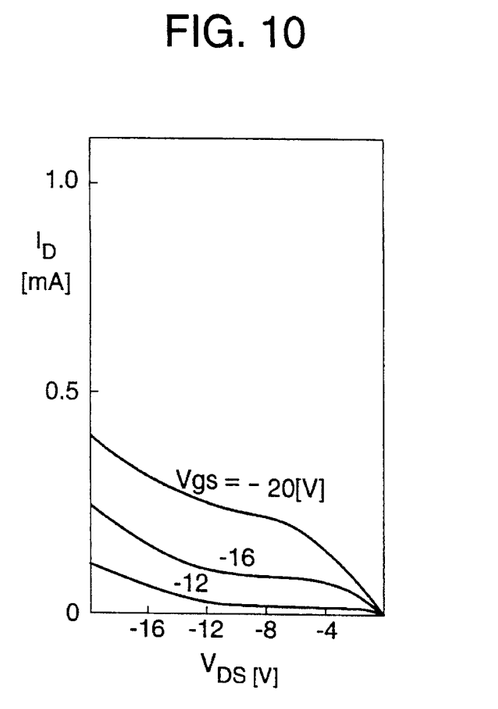
FIG. 10 is a graph showing the characteristic curves of a p-type TFT with no p-type impurity implanted in the channel region.
Figure 11:
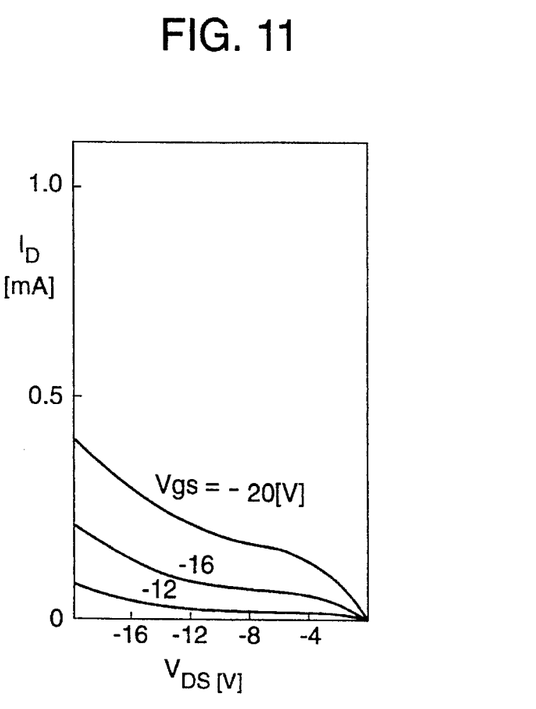
FIG. 11 is a graph showing the characteristic curves of a p-type TFT with p-type impurities implanted in the channel region.

The characteristics of the n-type TFT 5 in which the p-type impurities are implanted into the channel region are shown in FIG. 8, and the characteristics of an n-type TFT 35 in which the n-type impurities are not implanted into the channel region shown in FIG. 4 are indicated in FIG. 9. FIG. 10 shows the characteristic curves of a p-type TFT with no p-type impurity implant in the channel region. FIG. 11 shows the characteristic curves of a p-type TFT with the p-type impurities implanted in the channel region.

The comparison of the characteristic curves between FIGS. 8 and 9 show that the resistance is high and the drain current ($I_D$) is low in the n-type TFT 5 in which the p-type impurities are implanted into the channel region as compared with the TFT in which the p-type impurities are not implanted into the channel region. This is because the n-type TFT 5 has a higher inversion threshold voltage as a result of the implantation of the p-type impurities into the channel region.

When the characteristics of the above n-type TFTs are compared with the characteristics of the p-type TFTs 6 and 36 respectively, shown in FIGS. 10 and 11, it can be seen that an excellent symmetry of characteristics is maintained between the n-type TFT 5 and the p-type TFT 6 of this embodiment.

Figure 7:
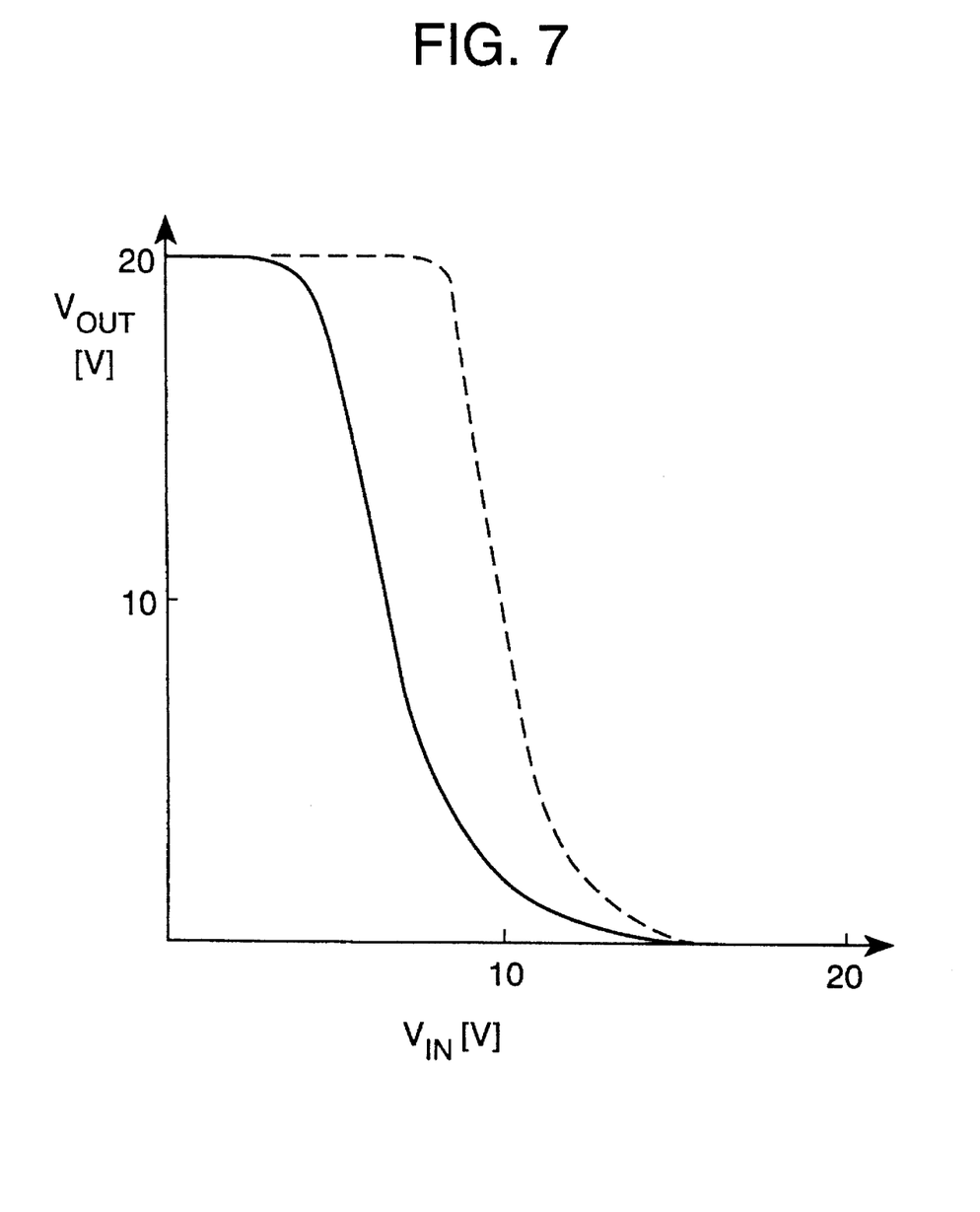
FIG. 7 is a graph showing the transfer characteristic of the CMOS inverter of the second embodiment (indicated by the dotted curve) and that of the first embodiment (indicated by the solid curve)

In FIG. 7, the transfer characteristic of the CMOS inverter of this embodiment for $V_{HL}$=20 Volts is indicated by the dotted curve. By comparison with the transfer characteristic of the CMOS inverter (indicated by the solid curve) in which the p-type impurities are not implanted into the channel region of the n-type TFT, it can be seen that the symmetry between the high and low sides is improved.

In the above embodiment, ion implantation for controlling the threshold voltage is made only into the channel region in the n-type TFT 5, but not into the channel region in the p-type TFT 6. However, it will be appreciated that impurities may be implanted simultaneously into the channel regions of the TFTs 5 and 6 to form a doped region in the TFT 6 as well as in the TFT 5. No great difference is noted between the characteristics of the p-type TFT 6 shown in FIG. 8 and the characteristics shown in FIG. 7 (with no impurity implantation into the channel region), which shows that The implantation into the channel region of the p-type TFT 6 causes very little effects on the transistor characteristics. This process has the advantage of eliminating the step of forming a photoresist having an opening over the region 14.

In the above embodiments, the pair of n-type and p-type TFTs 5 and 6 that constitute the CMOS inverter are provided with the same channel width (20 µm), but if the characteristics are not symmetrical between the n-type and p-type TFTs 5 and 6, it is possible to balance the driving capabilities between the TFTs by altering the-channel Widths thereof. Also, in the above embodiments, the n-type and p-type TFTs 5 and 6 are both provided with the same channel length (8 µm), but this also can be changed. Thus, by individually setting the channel length and channel width to suitable values for each of the n-type and p-type TFTs 5 and 6, it is possible to further improve the inverter characteristics.

Furthermore, in the above embodiments, the gate electrode 7 of the n-type TFT 5 is split into two gate electrode sections 7a and 7b, but it may be split into three or more gate electrode sections. In this case, the source-drain voltage is shared among more junctions than in the above embodiments. This serves to further improve the source-drain dielectric strength, realizing a CMOS inverter that can operate properly with an even higher voltage.

In the above embodiments, of the pair of TFTs constituting the CMOS inverter, the gate electrode 7 of the n-type TFT 5 only is split into subsections, but it will De appreciated that the gate electrode 8 of the p-type TFT 6 may also be split into subsections. In this case, the source-drain dielectric characteristic is improved also in the p-type TFT 6, providing further improved inverter characteristics.

Also, the TFTs may be so structured that the gate electrodes 7 and 8 are formed under the thin polysilicon film 50 and 60 (on the substrate side). In this case, however, the source regions 25, 28, the drain regions 26, 27, etc. cannot be formed in self-aligning fashion, therefore, a mask pattern must be formed in order to form these regions.

As described above, the thin-film semiconductor device of the present invention comprises thin-film transistors capable of reducing the leakage current and maintaining a high resistance in the "off" state for a high source-drain voltage. This serves to provide the inverter function free from malfunctioning and having excellent transfer characteristics.

Accordingly, the thin-film semiconductor device of the present invention is suitable for a driver circuit to which a comparatively high voltage is applied, particularly for a driver circuit for an active matrix liquid crystal display.

Further, according to the thin-film semiconductor device of the present invention, a good symmetry of characteristics is obtained between the n-type and p-type thin-film transistors that constitute the CMOS inverter. As a result, no appreciable bias is caused in the output voltage of the CMOS inverter, which serves to prevent the thin-film semiconductor device from malfunctioning. Furthermore, since this advantage is provided without increasing either the channel length or channel width of the thin-film transistors, there is no need to increase the device area, nor does it involve a decrease in the transfer speed.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A thin film semiconductor device for use as an inverter having an input terminal and an output terminal such that when a zero or relatively low voltage signal is input at said input terminal, a relatively high voltage signal is generated at the output terminal of said inverter, comprising:

a substrate;

a first semiconductor layer and a second semiconductor layer formed on said substrate;

an N-type thin film transistor including a first channel region formed in said first semiconductor layer, a first source region formed in said first semiconductor layer, a first drain region formed in said first semiconductor layer, a first gate insulating film formed on said first channel region, and a first gate electrode formed on said first gate insulating film;

a P-type thin film transistor including a second channel region formed in said second semiconductor layer, a second source region formed in said second semiconductor layer, a second drain region formed in said second semiconductor layer, a second gate insulating film formed on said second channel region, and a second gate electrode formed on said second gate insulating film, wherein said input terminal is connected to said first and second gate electrodes and said output terminal is connected to said first and second drain regions, said first gate electrode having a plurality of first gate electrode sections spaced apart along a channel length direction extending between the first source and drain regions, wherein when a substantially zero voltage is applied to said input terminal, leakage current between said first drain region and said first source region is minimized;

wherein a length of the first channel region is dimensioned to balance resistance characteristics of the thin film semiconductor device; and wherein N-type regions are formed in portions of the first channel region not covered by the gate electrode sections so as to form a plurality of channel subregions spaced apart along said channel length direction, each of the channel subregions being adjacent to the respective first gate electrode sections, whereby p-n junctions are formed across the first channel region when a relatively high voltage is applied between the first source region and the first drain region of the N-type thin film transistor.

2. A thin film semiconductor device according to claim 1 wherein said plurality of gate electrode sections are connected at one end outside of the first channel region.

3. The thin film semiconductor device according to claim 1 wherein said first channel region is doped with P-type impurities.

4. The thin film semiconductor device according to claim 1 wherein a width of either of the first and second channel regions is dimensioned to balance resistance characteristics of the N-type thin film transistor and the P-type thin film transistor.

5. The thin film semiconductor device according to claim 1 wherein lengths of either of the first and second channel regions is dimensioned to balance resistance characteristics of the N-type thin film transistor and the P-type thin film transistor.

6. The thin film semiconductor device according to claim 1 wherein said first source region and said first drain region are doped with N-type impurities.

7. The thin film semiconductor device according to claim 6 wherein the plurality of gate electrode sections function as a mask for doping N-type impurities in said first source region and first drain region.

8. The thin film semiconductor device according to claim 1 wherein said plurality of gate electrode sections are connected to each other at ends on the input terminal side.

9. The thin film semiconductor device according to claim 1 wherein said plurality of gate electrode sections are completely separate from each other and an electrical interconnection for electrically connecting said plurality of gate electrode sections is provided.

10. The thin film semiconductor device according to claim 1 wherein said second gate electrode has a plurality of second gate electrode sections spaced apart along a channel length direction.

11. A thin film semiconductor device according to claim 1, wherein a total length of the first channel region is 8 μm.

12. A thin film semiconductor device according to claim 1, wherein a length of each of the channel subregions is 4 μm.

13. A thin film semiconductor device, comprising:

a substrate;

a first semiconductor layer and a second semiconductor layer formed on said substrate;

an N-type thin film transistor including a first channel region formed in said first semiconductor layer, a first source region formed in said first semiconductor layer, a first drain region formed in said first semiconductor layer, a first gate insulating film formed on said first channel region, and a first gate electrode formed on said first gate insulating film;

a P-type thin film transistor including a second channel region formed in said second semiconductor layer, a second source region formed in said second semiconductor layer, a second drain region formed in said second semiconductor layer, a second gate insulating film formed on said second channel region, and a second gate electrode formed on said second gate insulating film;

wherein said first gate electrode has a plurality of first gate electrode sections spaced apart along a channel length direction extending between the first source and drain regions, and said first channel region has a plurality of channel subregions spaced apart along the channel length direction to form a plurality of p-n junctions when a relatively high voltage is applied between the first source region and the first drain region of the N-type thin film transistor, each of the channel subregions being adjacent to the respective first gate electrode sections, thereby sharing a voltage applied between the first source region and the first drain region with the plurality of p-n junctions and increasing dielectric strength between the first source region and the first drain region.

14. A thin film semiconductor device according to claim 13, wherein a total length of the first channel region is dimensioned to balance resistance characteristics of the thin film semiconductor device.

15. A thin film semiconductor device according to claim 14, wherein a total length of the first channel region is 8 μm.

16. A thin film semiconductor device according to claim 14, wherein a length of each of the channel subregions is 4 μm.

17. A thin film semiconductor device according to claim 13, wherein the second gate electrode has a plurality of second gate electrode sections spaced apart along a channel length direction extending between the second source and drain regions.

* * * * *